US012592705B2

(12) United States Patent
Wang et al.

(10) Patent No.: US 12,592,705 B2
(45) Date of Patent: Mar. 31, 2026

(54) CALIBRATION CIRCUIT TO SUPPRESS NON-LINEARITY

(71) Applicant: XILINX, INC., San Jose, CA (US)

(72) Inventors: Zhaowen Wang, Sunnyvale, CA (US); Lei Zhou, San Jose, CA (US); Stanley Y. Chen, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 56 days.

(21) Appl. No.: 18/807,720

(22) Filed: Aug. 16, 2024

(65) Prior Publication Data

US 2026/0051896 A1     Feb. 19, 2026

(51) Int. Cl.
*H03L 7/099*          (2006.01)
*H03L 7/081*          (2006.01)

(52) U.S. Cl.
CPC ............ *H03L 7/0998* (2013.01); *H03L 7/081* (2013.01)

(58) Field of Classification Search
CPC .............................. H03L 7/0998; H03L 7/081
See application file for complete search history.

(56) References Cited

U.S. PATENT DOCUMENTS

2006/0255866 A1* 11/2006 Hirai .................. H03K 5/15013
                                                                              331/45
2010/0318830 A1* 12/2010 Tsuchizawa ..... G01R 31/31709
                                                                              713/400

2011/0102028 A1*  5/2011  Nedachi .................. H03L 7/091
                                                                              327/144
2015/0229298 A1*  8/2015  Tomita ................... H03K 3/012
                                                                              327/143
2023/0082056 A1*  3/2023  Han .......................... G06F 1/10

OTHER PUBLICATIONS

Z. Wang, et al, "Multi-Phase Clock Generation for Phase Interpolation With a Multi-Phase, Injection-Locked Ring Oscillator and a Quadrature DLL," in IEEE Journal of Solid-State Circuits, vol. 57, No. 6, pp. 1776-1787, Jun. 2022.

* cited by examiner

*Primary Examiner* — Janice N Tieu

(74) *Attorney, Agent, or Firm* — Patterson + Sheridan, LLP

(57)                    ABSTRACT

Embodiments herein describe a calibration circuit including a multi-phase clock generator configured to receive a clock signal and generate a multi-phase clock output, the multi-phase clock generator including a first injection-locked oscillator, a mixer, a current digital-to-analog converter (IDAC), and a voltage to current converter (VTOI), the IDAC and VTOI configured to fine tune offsets of the mixer and an input of the VTOI, and overcome phase errors from injection locking disturbance. The multi-phase clock generator further includes a pre-skew buffer configured to receive the multi-phase clock output from the multi-phase clock generator and generate multiple data signals and a phase interpolator (PI) configured to receive the multiple data signals from the pre-skew buffer and generate a shifted clock signal of the clock signal received by the multi-phase clock generator.

20 Claims, 5 Drawing Sheets

100

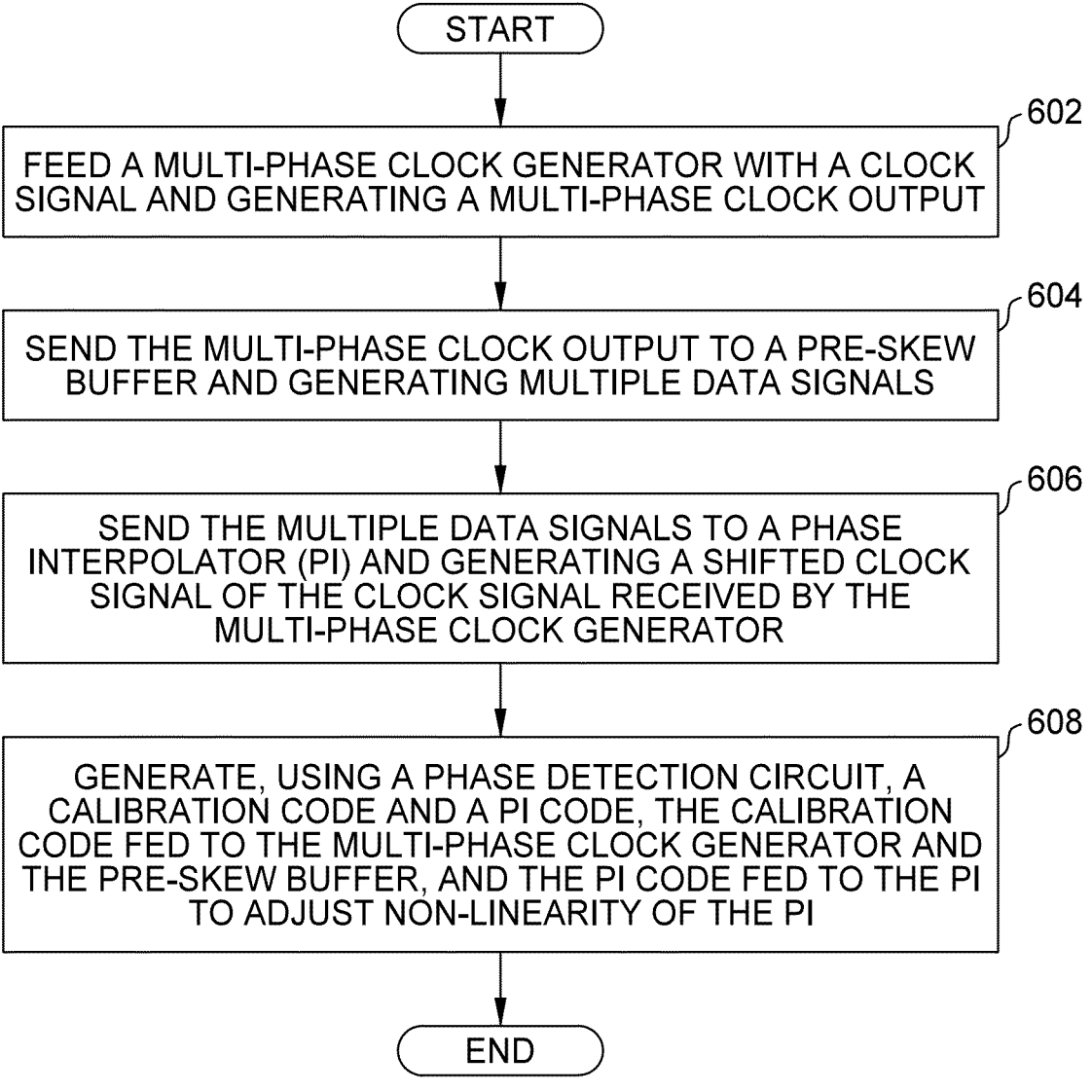

START

602

FEED A MULTI-PHASE CLOCK GENERATOR WITH A CLOCK SIGNAL AND GENERATING A MULTI-PHASE CLOCK OUTPUT

604

SEND THE MULTI-PHASE CLOCK OUTPUT TO A PRE-SKEW BUFFER AND GENERATING MULTIPLE DATA SIGNALS

606

SEND THE MULTIPLE DATA SIGNALS TO A PHASE INTERPOLATOR (PI) AND GENERATING A SHIFTED CLOCK SIGNAL OF THE CLOCK SIGNAL RECEIVED BY THE MULTI-PHASE CLOCK GENERATOR

608

GENERATE, USING A PHASE DETECTION CIRCUIT, A CALIBRATION CODE AND A PI CODE, THE CALIBRATION CODE FED TO THE MULTI-PHASE CLOCK GENERATOR AND THE PRE-SKEW BUFFER, AND THE PI CODE FED TO THE PI TO ADJUST NON-LINEARITY OF THE PI

END

CALIBRATION CIRCUIT TO SUPPRESS NON-LINEARITY

TECHNICAL FIELD

Examples of the present disclosure generally relate to circuits, and in particular, to a circuit for calibrating non-linearity in phase interpolators.

BACKGROUND

In circuits and electronic systems, the need to calibrate non-linearity arises due to various factors that can cause deviations from the ideal linear behavior of components or systems. Non-linearity refers to the inability of a system or component to exhibit a linear relationship between input and output signals. Calibration of non-linearity involves adjusting or compensating for these deviations to improve the accuracy and performance of the system. In circuits and electronic systems, calibration of non-linearity is beneficial to ensure accurate and reliable operation. As the accuracy requirements gets more stringent, calibration of non-linearity also becomes necessary for high-performance electronic systems. By compensating for deviations from ideal linear behavior in components, sensors, amplifiers, and signal processing stages, calibration techniques enhance system accuracy, performance, and robustness, enabling electronic systems to meet stringent requirements for precision, reliability, and efficiency.

SUMMARY

One embodiment described herein is a calibration circuit including a multi-phase clock generator configured to receive a clock signal and generate a multi-phase clock output, the multi-phase clock generator including a first injection-locked oscillator, a mixer, a current digital-to-analog converter (IDAC), and a voltage to current converter (VTOI), the IDAC and VTOI configured to fine tune offsets of the mixer and the VTOI. The multi-phase clock generator further includes a pre-skew buffer configured to receive the multi-phase clock output from the multi-phase clock generator and generate multiple data signals and a phase interpolator (PI) configured to receive the multiple data signals from the pre-skew buffer and generate a shifted clock signal of the clock signal received by the multi-phase clock generator.

One embodiment described herein is a calibration circuit including a multi-phase clock generator configured to receive a clock signal and generate a multi-phase clock output, a pre-skew buffer configured to receive the multi-phase clock output and generate multiple data signals, a phase interpolator (PI) configured to receive the multiple data signals and generate a shifted clock signal of the clock signal received by the multi-phase clock generator, and a phase detection circuit configured to generate a calibration code and a PI code, the calibration code fed to the multi-phase clock generator and the pre-skew buffer, and the PI code fed to the PI to adjust non-linearity of the PI.

One embodiment described herein is a method including feeding a multi-phase clock generator with a clock signal and generating a multi-phase clock output, sending the multi-phase clock output to a pre-skew buffer and generating multiple data signals, sending the multiple data signals to a phase interpolator (PI) and generating a shifted clock signal of the clock signal received by the multi-phase clock generator, and generating, using a phase detection circuit, a calibration code and a PI code, the calibration code fed to the multi-phase clock generator and the pre-skew buffer, and the PI code fed to the PI to adjust non-linearity of the PI.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 6 illustrates a method for implementing the calibration circuit of FIG. 2, according to an example.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
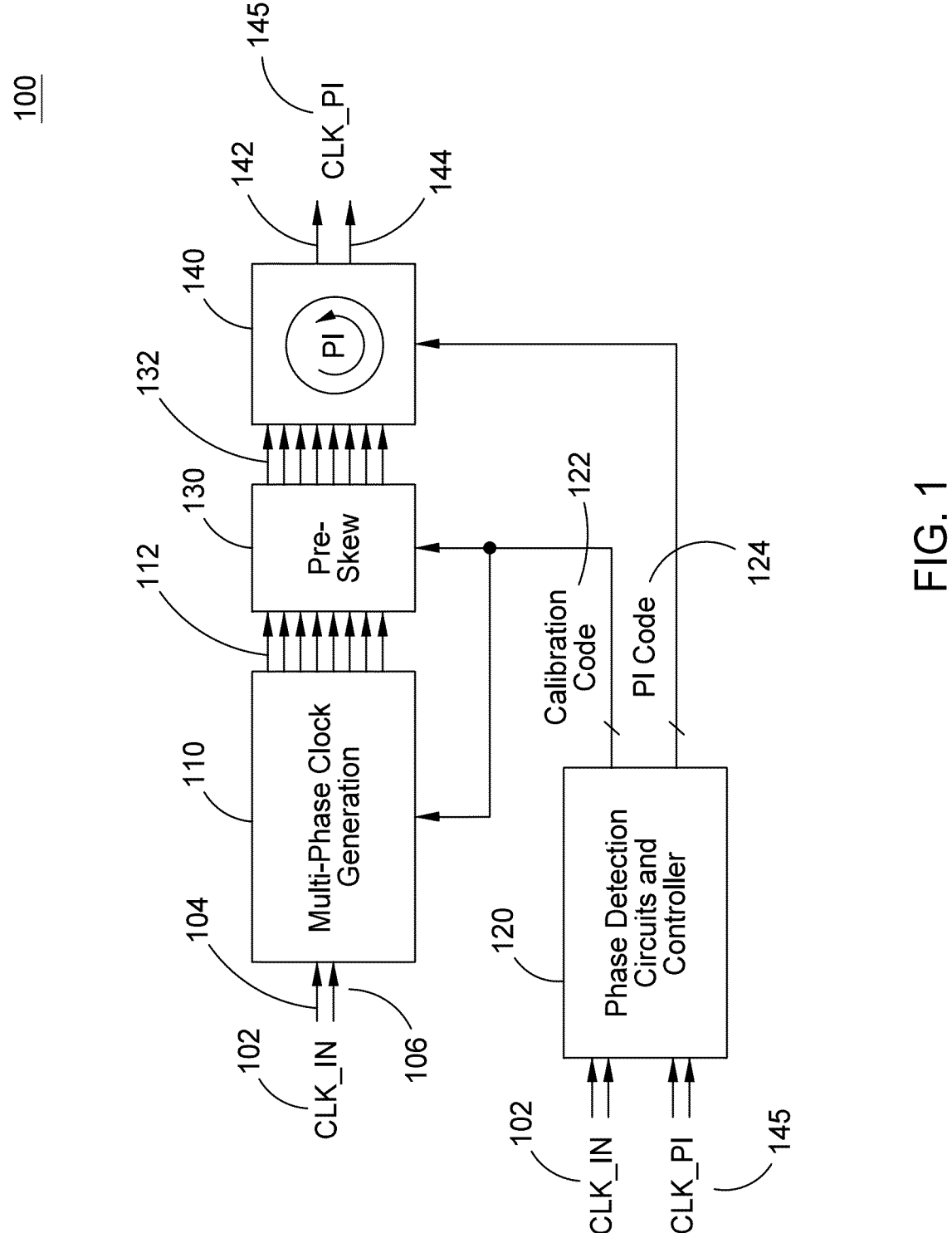
FIG. 1 illustrates a calibration circuit, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the embodiments herein or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Circuit non-linearity refers to any deviation from the ideal linear behavior of electronic components, which can come from deterministic sources like circuit architecture or random sources like transistor fabrication imperfections. In linear systems, the relationship between the input and output signals is expected to follow linear principles. Nevertheless, in realistic systems, the relationship between the input and output signals may exhibit non-linear effects that may cause the output to deviate from the expected linear response, such as generation of harmonics or intermodulation products not present in the original signal. Non-linearities can also lead to frequency-dependent distortion, amplitude modulation or phase modulation in the output signal.

Non-linearities can be caused from non-linear behavior of electronic components. In one example, a multi-phase clock generator may cause non-linearity. In one example, the injection-locked ring oscillator generates multi-phase clocks from its input injection clocks. However, the injection phases are naturally asymmetric from the other non-injection phases. As a result, there are intrinsic phase non-linearities and amplitude non-linearities among the multi-phase clocks. Moreover, due to transistor mismatches, there are random phase errors among these clocks, further introducing non-idealities in phase and amplitude.

In one example, a phase interpolator (PI) may further introduce non-linearities. The PI generates output signals with phases that lie between two input reference signals. The multi-phase errors from the multi-phase clock generators directly translates to the phase non-linearities of the PI. Moreover, the PI design imperfection and transistor mismatch can lead to deviations from the expected behavior and may introduce errors or distortions in the output signal.

The PI may be employed by a clock-data recovery (CDR) circuit. The CDR involves the recovery of the clock signal for retrieving the transmitted data. Data is transmitted serially, that is, one bit at a time, over a communication channel. Along with the data, a clock signal is transmitted to indicate the timing of each bit. Thus, a transmitter generates a serial data stream by encoding the digital data into a serial bit-stream and transmitting it along with a clock signal over the communication channel. The lock signal serves as a reference for the receiver to sample and interpret the incoming data. At the receiver end, the clock data recovery circuit synchronizes with the incoming data stream by extracting the clock signal from the received signal. The recovered clock signal is used to sample the incoming data at the correct timing instances so that the receiver can accurately decode the transmitted data. The data can be extracted using a CDR loop, which locks onto the timing of the incoming data transitions to generate a stable clock signal synchronized with the data stream. Once the clock signal is extracted, the CDR circuit regenerates a stable clock signal with the correct frequency and phase alignment. The regenerated clock signal is used to sample the incoming data stream at the correct timing instances.

CDR circuits may also include jitter compensation mechanisms to mitigate the effects of timing variations (jitter) in the received signal. Jitter may result from channel noise, signal distortion, and timing mismatches. CDR helps compensate for jitter and maintain signal integrity. The linearity of a PI directly determines the jitter tolerance and also the performance under spread spectrum clocking or ppm tracking in the clock data recovery system. As the link data rate continues to increase, the PI operation frequency also increases accordingly, forcing the PI to have a finer timing resolution. However, the PI resolution is degraded by various sources, including intrinsic interpolation errors, input phase errors from multi-phase clock generators, layout imperfections, and transistor mismatches. These imperfections starts to dominate the overall communication budget, and limit the highest performance that a system can achieve as the data rate scales aggressively.

An injection-locked oscillator (ILO) with a quadrature locked-loop (QLL) has been proposed to generate 8-phase clocks for a PI to reduce the intrinsic interpolation errors. However, the ILO may suffer from large phase errors due to injection, and may degrade the PI linearity. Moreover, as the ILO operates at a lower supply, it is also more prone to the phase disturbances from strong injection signals. In one example, this error can be up to 3.5 ps (14LSB for an 8-bit, 16 GHz PI) in a worst case scenario, while a typical link budget only allows 1 ps budget. While a high injection strength is useful for robust locking and jitter suppression, the strong injection may degrade the PI linearity due to strong disturbance to the ILO. Therefore, a channel clocking system adopting the combination of ILOs and PIs is faced with a tradeoff between jitter and linearity in terms of the injection strength. Moreover, as the supply is lowered for a more advanced technology node and power saving, the circuits are also more prone to transistor mismatches, and layout imperfections, making it more difficult to maintain the PI linearity. As such, it may be difficult for conventional architectures including ILOs and PIs to meet the jitter and linearity specifications for increasingly high-speed data links.

In the example embodiments, the PI employed by a CDR circuit is calibrated to correct for non-linearities, which may lead to errors in phase estimation and signal generation, as well as errors in timing recovery. By correcting non-linearities of the PI, the CDR can meet its timing budget to achieve accurate data recovery. As such, the PI has finer timing resolution. The calibration involves using an ILO and a voltage to current converter (VTOI). The ILO provides for phase control by synchronizing with an external injection signal. In particular, the phase nonlinearity of the PI is sensed by phase detection circuits based on digital sampling or other algorithms with little circuit overhead. Therefore, the calibration system is a closed loop system that can be adapted for different protocols under process variations. The calibration algorithm first finds the optimal code for the current DAC of the VTOI circuit, and tunes the QLL to a better operation point such that the injection phase error is minimized. Thus, a high injection strength can be selected while the injection phase errors are minimal. Furthermore, 8-phase pre-skew buffers fine tune the 8-phase clocks entering the PI. All the phase errors caused by random circuit mismatches, layout imperfections, and residual errors from the injection locking can be thus be minimized.

FIG. 1 illustrates a calibration circuit, according to an example.

The calibration circuit 100 includes a multi-phase clock generator 110 (or multi-phase clock generation circuit) that receives an input. The input may be a clock signal 102 (CLK_IN). The clock signal 102 may include a first phase clock signal 104 and a second phase clock signal 106. The clock signal 102 may be a high-speed clock signal. In one example, the first phase clock signal 104 may be at 0 degrees and the second phase clock signal 106 may be at 180 degrees. As such, a two-phase clocking technique may be employed. The clock signal 102 may operate at high frequencies. In one example, the frequency range may be from about 4 GHz to about 16 GHz. The higher frequencies allow for faster data processing and data transfer rates. For example, at a frequency of 16 GHz, the clock period is about 62.5 picoseconds (ps), which results is a very fast clock.

The multi-phase clock generator 110 generates multi-phase clocks. In one example, the multi-phase clock generator 110 generates 8-phase clocks. Thus, the multi-phase clock generator 110 receives the two-phase clocks (i.e., the first phase clock signal 104 and the second phase clock signal 106) to generate 8-phase clocks 112. The 8-phase clocks 112 may be offset by 45 degrees ideally. The 8-phase clocks 112 are provided to a pre-skew buffer 130.

In one example, if the clock signal 102 has a high frequency of 16 GHz, that 16 GHz frequency will be divided into 8 signals by the multi-phase clock generator 110. In other words, one clock period is partitioned into 8 chunks. As such, 62.5 ps is divided by 8, which results in 7.8125 ps. This results in each of the 8 phases spaced by 7.8125 ps. Thus, each of the 8-phase clocks 112 is spaced by 7.8125 ps.

The pre-skew buffer 130 is used to compensate for skew or timing misalignment between parallel data signals before they are transmitted over a data bus. Skew refers to the timing misalignment between different data signals within a parallel data bus. The pre-skew buffer compensates for this skew by adjusting the timing of individual data signals before they are transmitted, ensuring that all the data signals arrive at the receiver simultaneously. The pre-skew buffer 130 may include delay elements or adjustable delay lines for each data signal. The delay elements introduce controlled delays to the data signals to allow for precise adjustment of the signal timing to align the data signals. The pre-skew buffer 130 generates 8 data signals 132.

The 8 data signals (i.e., the 8-phase clocks 112) received by the pre-skew buffer 130 may be weighted. In one example, two of the eight data signals are selected. A user can select a first signal at 0 degrees and a second signal at 45 degrees. A first weight is assigned to the first signal at 0 degrees and a second weight is assigned to the second signal at 45 degrees within the limits defined by the phase interpolator (PI) 140. The first weight may be 0.5 given to the first signal at 0 degrees and the second weight may be 0.5 given to the second signal at 45 degrees. The output will then be 22.5 degrees in principle.

In another example, two of the eight data signals are selected. A user can select a first signal at 45 degrees and a second signal at 90 degrees. A first weight is assigned to the first signal at 45 degrees and a second weight is assigned to the second signal at 90 degrees within the limits defined by the PI 140. The first weight may be 0.9 given to the first signal at 45 degrees and the second weight may be 0.1 given to the second signal at 90 degrees. The output will then be 4.5 degrees in principle.

Thus, a user can select which of the 8 data signals 132 to send to the PI 140. In one example, the user selects any neighboring pair of the 8 data signals 132 to send to the PI 140. The PI 140 then generates an output clock 145 (CLK_PI) based on the two selected data signals.

Moreover, the multi-phase clock generator 110 may include deterministic errors. For example, the layout symmetry of the circuits will not be perfect. However, even if perfect layout symmetry of the circuits could be achieved, and each of the 8-phase clocks 112 is based on 7.8125 ps to achieve a perfect 45 degree difference between the 8-phase clock 112, the transistors within the multi-phase clock generator 110 will exhibit random mismatches. In one example, the W/L ratio may be 10 in the design phase. However, in the fabrication phase, the W/L ratio may be +/−1, that is, 9 or 11. The random mismatches thus may degrade the phase accuracy of the 8-phase clocks 112. As such, because of stringent mismatch requirements, simply using the multi-phase clock generator 110 without using any further calibration may not suffice for the accuracy requirement of the PI 140. To address this issue, the example embodiments incorporate the pre-skew buffer 130 between the multi-phase clock generator 110 and the PI 140.

In one example, in the design phase, one data signal may be 0 degrees and the other data signal may be 45 degrees. However, after the fabrication phase, it is determined that the one data signal is 0 degrees and the other data signal is 50 degrees (instead of the 45 degrees). If an equal weighting or weight is assigned to the 0 degree data signal and the 50 degree data signal, the output is 25 degrees, which is off by 2.5 degrees because if the 0 degree data signal and the 45 degree data signal were used, the output would be 22.5 degrees. To address this offset, the pre-skew buffer 130 is added. The pre-skew buffer 130 detects that the second data signal is too big (5 degrees over) and corrects such data signal by pulling the phase back to 45 degrees. The pre-skew buffer 130 thus corrects phase offsets from the multi-phase clock generator 110 before the signals are provided to the PI 140. As a result, there is no need to spend too much time and resources (e.g., power and area) in designing the perfect multi-phase clock generator, as the pre-skew buffer 130 compensates for any phase differences detected at the output of the multi-phase clock generator 110. Therefore, certain phase differences at the output of the multi-phase clock generator 110 are tolerated.

The output clock 145 generated by the PI 140 provides phase shifted values. The output clock 145 may also be referred to as a shifted clock. The output clock 145 may include a first shifted clock signal 142 and a second shifted clock signal 144.

The purpose of the multi-phase clock generator 110 and the pre-skew buffer 130 is to shift the clock signal 102 to different values to generate the shifted clock, that is, output clock 145. For example, if the first phase clock signal 104 is 0 degrees and the second phase clock signal 106 is 180 degrees. The user may want to shift the first phase clock signal 104 from 0 degrees to 90 degrees. The multi-phase clock generator 110 and the pre-skew buffer 130 assist in achieving such phase shift. In another example, the multi-phase clock generator 110 and the pre-skew buffer 130 may shift the output signal to different values, such as 91 degrees or 92 degrees.

The phase shifting or value shifting is advantageous in providing, e.g., for a more accurate sampling system. The first shifted clock signal 142 and the second shifted clock signal 144 of the output clock 145 may be provided to a sampling system (not shown). The sampling system samples a center of the data. This involves aligning the sampling points precisely with the key points of the analog signal. Center sampling implies that the samples are taken at the midpoint of each data segment or signal cycle, capturing the most representative value of the signal during each sampling period. As such, it would be advantageous to better align the output clock 145 with the center of the data in order to achieve more precise sampling. More precise sampling may refer to an improvement in the signal-to-noise (SNR) ratio. Therefore, the motivation of the calibration circuit 100 is to accurately shift the clock signal 102 to provide for an output clock 145 that is precise, which in turn, is fed into other circuits, such as a sampler circuit or sampling system.

Further, a phase detection circuit 120 is provided to detect the phase differences at the output of the multi-phase clock generator 110. The phase detection circuit 120 generates a calibration code 122 and a PI code 124. The calibration code is fed into the multi-phase clock generator 110 and the pre-skew buffer 130. The PI code is fed into the PI 140.

Figure 2:
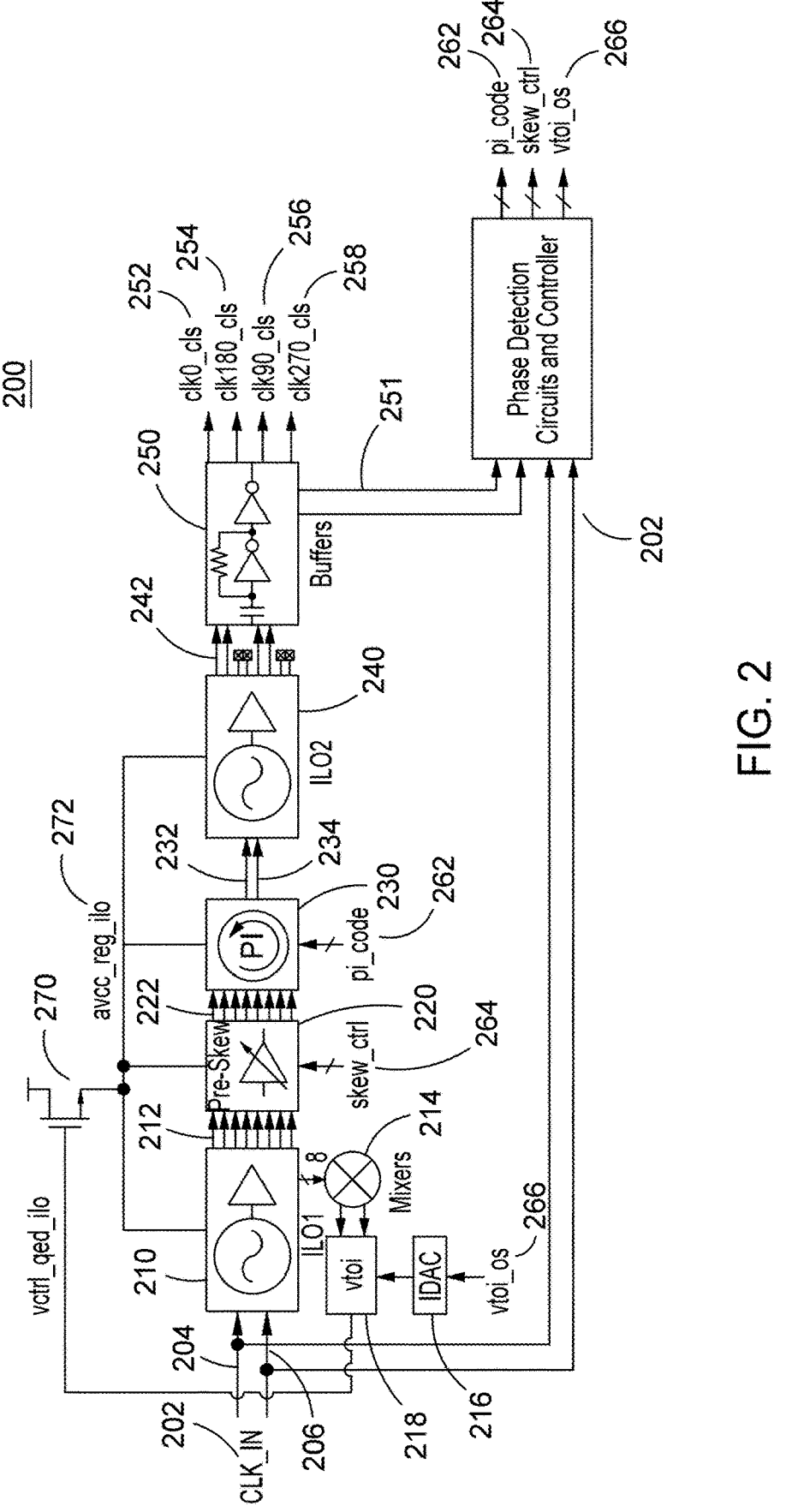
FIG. 2 illustrates the calibration circuit of FIG. 1 including an injection-locked ring oscillator and a phase interpolator, according to an example.

FIG. 2 illustrates the calibration circuit of FIG. 1 including an injection-locked ring oscillator and a phase interpolator, according to an example.

The calibration circuit 200 includes an injection-locked oscillator (ILO) 210. An injection-locked oscillator (ILO) is a type of oscillator circuit that operates based on the principle of injection locking, which involves synchronizing the oscillation of one oscillator (slave oscillator) to the frequency and phase of another external signal (master signal). Thus, the slave oscillator's frequency and phase are controlled by an external master signal rather than by its internal resonant circuit.

The calibration circuit 200 includes the ILO 210 that receives an input. The input may be a clock signal 202 (CLK_IN). The clock signal 202 may include a first phase clock signal 204 and a second phase clock signal 206. The clock signal 202 may be a high-speed clock signal. In one example, the first phase clock signal 204 may be at 0 degrees and the second phase clock signal 206 may be at 180 degrees. As such, a two-phase clocking technique may be employed. The clock signal 202 may operate at high frequencies, as discussed above with reference to FIG. 1.

The ILO 210 produces an 8-phase clock output 212 that is fed into the pre-skew buffer 220. The ILO 210 is used as part of a multi-phase clock generator (of FIG. 1). The ILO 210 itself has an 8-phase output. The input to the ILO 210, that is, clock signal 202 will lock the ILO 210. The 8-phase clocks (i.e., the 8-phase clock output 212) may be offset by 45 degrees. The 8-phase clock output 212 is provided to a pre-skew buffer 220. However, since two-phase clock (i.e., the first phase clock signal 204 and the second phase clock signal 206) are input to the ILO 210, two of the outputs of the ILO 210 may experience a phase offset. This issue is addressed by the pre-skew buffer 220, which can fine-tune the offsets (i.e., phase offsets) before the signals are received by the PI 230. The pre-skew buffer 220 thus generates 8 data signals 222. The PI 230 generates the shifted clock of the clock signal 202. The output clock generated by the PI 230 provides phase shifted values. The output clock may also be referred to as a shifted clock. The output clock may include a first shifted clock signal 232 and a second shifted clock signal 234.

The output of the PI 230 is fed into another ILO 240. That is, the ILO 240 receives the first shifted clock signal 232 and the second shifted clock signal 234. The ILO 240 generates four phases 242 that are fed into buffers 250. In one example, the buffers 250 may be current buffers. The output of the buffers 250 will be four clock signals. In particular, the four clock signals may be, e.g., a first clock signal 252 at phase 0, a second clock signal 254 at phase 180, a third clock signal 256 at phase 90, and a fourth clock signal 258 at phase 270. The four clock signals may be provided to, e.g., an analog-to-digital converter (ADC) (not shown) including a sampling system (not shown).

The sampling system samples a center of the data. This involves aligning the sampling points precisely with the key points of the analog signal. Center sampling implies that the samples are taken at the midpoint of each data segment or signal cycle, capturing the most representative value of the signal during each sampling period. As such, it would be advantageous to better align the output clock of the PI 230 with the center of the data in order to achieve more precise sampling. More precise sampling may refer to an improvement in the signal-to-noise (SNR) ratio. Therefore, the motivation of the calibration circuit 200 is to accurately shift the clock signal 202 to provide for a precise output clock at the PI 230, which in turn, is fed into other circuits, such as a sampler circuit or sampling system. Thus, the four clock signals at the output of the buffers 250 are aligned with the center of the data to maximize the SNR in that sampling behavior.

The four phases 242 at the output of the ILO 240 are shifted by the same amount as the phase shift at the output of the PI 230. Therefore, if the four phases 242 at the output of the ILO 240 are shifted by 10 degrees, then the phase shift at the output of the PI 230 is also shifted by 10 degrees.

The clock signals 251 are a copy of two of the clocks signals output from the buffers 250. For example, the clock signals 251 may be a copy of the first clock signal 252 at phase 0 and the second clock signal 254 at phase 180. The clock signals 251 are fed into the phase detection circuit 260. Additionally, the clock signals 251 are also shifted by the same amount as the phase shift at the output of the PI 230. As such, if the phase shift at the output of the PI 230 is shifted by 10 degrees, the phase shift of the clock signals 251 is also shifted by 10 degrees.

The phase detection circuit 260 generates three codes, that is, a PI code 262, a skew control code 264, and a VTOI code 266. The skew control code 264 is fed back to the pre-skew buffer 220 and the PI code 262 is fed back into the PI 230. As noted above, a weight is assigned to the two signals that are selected at the output of the ILO 210. The weights are assigned by the pre-skew buffer 220. In one example, if a first signal received by the pre-skew buffer 220 is 0 degrees, a delay difference is measured between the clock signals 251 and the input clock or clock signal 202. So, if the PI code 262 is set to 45 degrees, the weight assigned to the 45 degree signal will be 1. Since the signal is set to 45 degrees and the output is detected to be 45 degrees, the weight can be 1. However, if there is a mismatch, either random or deterministic, then the weight will be adjusted to compensate for that phase offset. For example, if the phase is detected at 50 degrees at the clock signals 251, the skew control code 264 can be adjusted (e.g., decreased) to adjust the signal back to 45 degrees before being received by the PI 230. Similarly, if the phase is detected at 85 degrees at the clock signals 251, the skew control code 264 can be adjusted (e.g., increased) to adjust the signal back to 90 degrees before being received by the PI 230. Therefore, the skew control code 264 enables the phases to be restored to their initial values. The skew control code 264 includes 7 bits for controlling the 8-phase clock outputs independently at the pre-skew buffer 220. In total, there are 7 bits×8 phases=56 bits to control or adjust the phase of the clock signals provided to the PI 230.

The multi-phase generation circuit includes the ILO 210, as well as a mixer 214, a current digital-to-analog converter (IDAC) 216 and a voltage to current converter (VTOI) 218. The ILO 210 has a free running frequency. The term free running means that the input signal connection is disabled or the net connection (i.e., the first phase clock signal 204 and the second phase clock signal 206) is removed. If the input frequency is 16 GHZ, depending on the supply 272 (avc-c_reg_ilo), the ILO 210 may oscillate between, e.g., 14 GHz and 18 GHz. However, the frequency of the ILO 210 should be stabilized to be close to the input frequency of the clock signal 202. In other words, ideally, the input frequency of the clock signal 202 should match or be equal to the frequency of the ILO 210. There are several benefits to matching the free running frequency of the ILO 210 to the frequency of the clock signal 202. The first benefit is noise reduction. When the two frequencies are identical, then the frequency of the clock signal 202 will have the widest bandwidth to suppress the noise or I/O noise. If the I/O noise is suppressed, then power consumption may be reduced. As a result, if the input frequency of the clock signal 202 is aligned with the frequency of the ILO 210, power can be saved and noise can be reduced.

Another issue with the ILO 210 is that the ILO 210 has a locking range. The locking range may be +/−10%. For example, if the input frequency is 16 GHZ, even if the ILO 210 is running at a frequency of 15 GHZ, the ILO 210 can be locked to 16 GHz. Similarly, if the input frequency is 16 GHz, even if the ILO 210 is running at a frequency of 17 GHz, the ILO 210 can be locked to 16 GHz. The frequency of the ILO 210 can be locked at 16 GHz because the frequency is within the +/−10% range.

The ILO 210 includes injection locking, which means that when the frequency of the clock signal 202 is close to the frequency of the ILO 210, the 8-phase clock output 212 will achieve the best match. The optimal frequency for phase matching is slightly higher than the input frequency. For example, if the first phase clock signal 204 is 0 degrees and the second phase clock signal 206 is 180 degrees, and the two frequencies are closely matched to each other, the 8 signals of the 8-phase clock output 212 are spaced apart by close to 45 degrees. If the two frequencies start to deviate from each other, then the 8 signals of the 8-phase clock output 212 also start to deviate, which cause the error to start to accumulate.

As noted above, the multi-phase generation circuit includes the ILO 210, as well as the mixer 214, the IDAC 216 and the VTOI 218. The mixer 214 receives the 8-phase clock output 212 and detects the phase error for each of the 8 phases. The mixer minimizes the errors of the 8 phase clock signals and feeds the results to the regulation device 270 by sending signal vctrl_qed_ilo. The regulation device 270 provides the supply 272 (avcc_reg_ilo). The supply 272 guarantees that there is proper self-oscillation of the ILO 210 such that it can be locked robustly across all of the printed circuit board. Thus, by adding the mixer 214, the phase difference or phase offsets are corrected. However, by adding only the mixer 214, relatively large phase differences can be still be present. In other words, the phase compensation provided by the mixer 214 alone is not sufficient enough to provide for proper phase compensation. One reason for this is the two-phase input (i.e., the clock signal 202) may disturb the symmetry of the oscillator of the ILO 210. This input disturbance may be detectable by the mixer 214, which causes a further offset within the mixer 214. Moreover, the mixers may have transistor mismatches, which are more prominent at low supply and high clock speed. The deviation from an ideal supply value, leads to a large common error in the eight phase clocks.

To provide for further phase compensation without increasing the pre-skew buffer range, to further minimize the deterministic error, the IDAC 216 and the VTOI 218 are also added with the mixer 214. The IDAC 216 is a device that converts a digital input signal into an analog current output. The VTOI 218 is a voltage to current converter that converts an input voltage signal into a proportional current signal. The IDAC 216 and the VTOI 218 provide an offset to the mixer 214 to offset for the input disturbance from the two-phase input (i.e., the clock signal 202). The mixer 214 receives a high frequency signal and then the mixer 214 converts the high frequency signal to a low frequency signal. The IDAC 216 and the VTOI 218 are both low frequency and have low power consumption because they operate in a low-speed, e.g., around 10 MHz.

The VTOI 218 performs as a gain stage. The gain stage is around 60 dB. The VTOI 218 thus amplifies the voltage. The IDAC 216 is coupled to the VTOI 218 to apply a reverse amount of the voltage detected at the output of the mixer 214. In one example, the amount of voltage may be about 10 mV. As such, the voltage output of the mixer 214 can be canceled out by the IDAC 216. This provides for a 4× improvement to the phase offset or phase deviation.

In summary, a high-speed clock (CLK_IN) is injected into a first ring oscillator (ILO1), and a mixer-based phase detector detects the phase error and tunes the oscillator's self-resonance frequency to reduce the phase errors. The 8-phases from the ILO1 are corrected by a set of pre-skew buffers, and then enter the subsequent phase interpolator. The PI output locks the next ring oscillator (ILO2) for multi-phase clock generation for downstream circuits. The ILO2 is a replica of ILO1, meaning they share the same supply and track each other's frequency with the same phase detection loop.

The ILO1 phase errors are directly caused by the phase imbalances from injection locking. As the supply reduces, the injection locking may cause errors up to 3.5 ps (14 LSB) at 16 GHz for an 8-bit design. Moreover, the mismatch from the transistor mismatch in the ILO1, the phase detector, and the amplifier circuits further degrades the multi-phase accuracy of the PI. The PI itself further contributes to the errors due to its layout asymmetry and transistor mismatch. As a result, the INL may include a systematic part of up to 3.5 ps error, and a random part with a sigma up to 0.45 ps. Therefore, calibration is useful for high-precision, high-speed Pls to further reduce non-linearities.

In summary, the example embodiments, introduce a current DAC or IDAC to tune the QLL to a better operation point based on the detected phase errors. This tunes the multi-phase clocks into the PI simultaneously with one tuning knob. Moreover, 8-phase pre-skew buffers further fine tune each of the 8-phase clocks entering the PI. As a result, all the phase errors caused by random circuit mismatches, layout imperfections, and residual errors from the injection locking can be significantly reduced. The phase nonlinearity of the PI can be sensed by phase detection circuits based on digital sampling or other algorithms with minimal circuit overhead.

Figure 3:
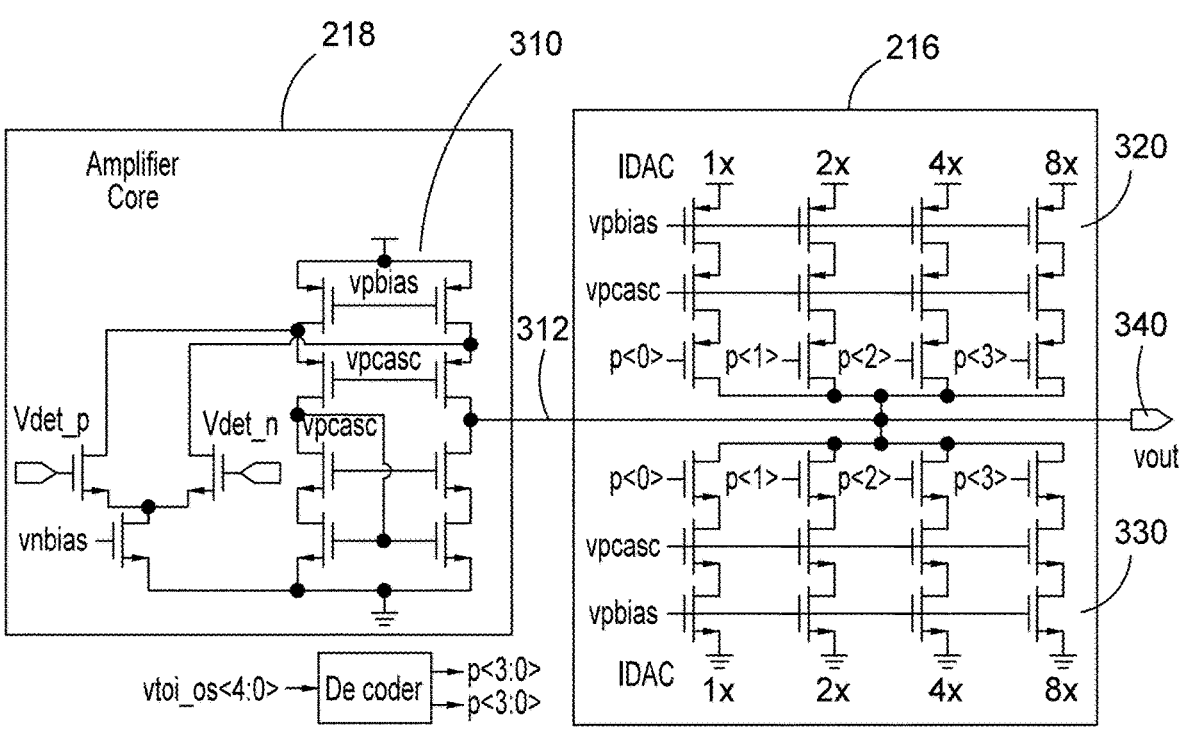
FIG. 3 illustrates a circuit of a voltage to current converter (VTOI) including a current digital-to-analog converter (IDAC), according to an example.

FIG. 3 illustrates a circuit of a voltage to current converter (VTOI) including a current digital-to-analog converter (IDAC), according to an example.

The VTOI 218 includes a plurality of transistors 310 with an output 312 coupled to the IDAC 216. The IDAC 316 includes a first set of transistors 320 and a second set of transistors 330, as well as an output 340. The first set of transistors 320 may be p-type metal oxide semiconductor (PMOS) transistors and the second set of transistors 330 may be n-type MOS (NMOS) transistors. If the output 340 of the IDAC 316 is to be raised, one or more additional transistors of the first set of transistors 320 may be turned on. By turning on more PMOS circuits, more current is provided to the output 340. If the output 340 of the IDAC 316 is to be lowered, one or more additional transistors of the second set of transistors 330 may be turned on. As such, more current will be drained out of the output 340 to bring down the voltage.

Figure 4:
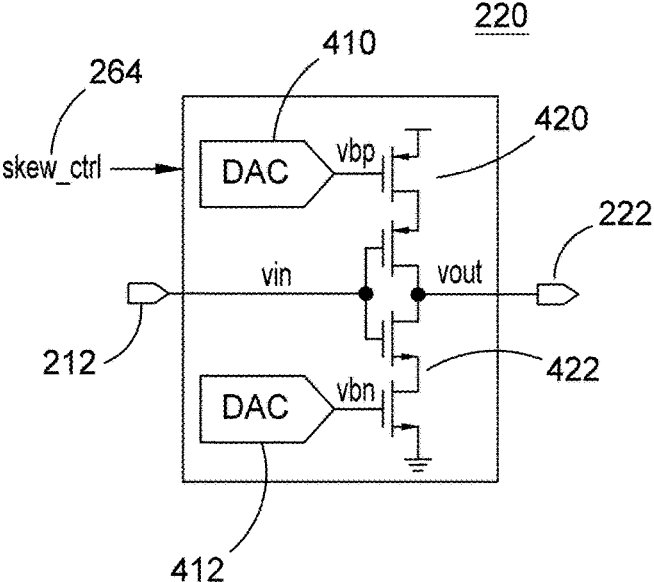
FIG. 4 illustrates a circuit of a pre-skew buffer, according to an example.

FIG. 4 illustrates a circuit of a pre-skew buffer 220, according to an example.

The pre-skew buffer 220 includes a first DAC 410 coupled to a first set of transistors 420 and a second DAC 412 coupled to a second set of transistors 422. The input to the pre-skew buffer 220 is the 8-phase clock output 212. The output of the pre-skew buffer 220 is the 8 data signals 222. The pre-skew buffer 220 receives the skew control code 264 after the input disturbances from the mixer 214 have been corrected for by the VTOI 218 and the IDAC 216. The skew control code 264 provides for further phase compensation adjustment to fine tune the phases input to the PI 230.

For example, if the input-to-output delay is to be small, the input of the first set of transistors 420 will be lowered and the input of the second set of transistors 422 will be raised. The first set of transistors 420 may be PMOS transistors and the second set of transistors may be NMOS transistors. If the input to output is to be larger, the input of the first set of transistors 420 will be raised and the input of the second set of transistors 422 will be lowered. As such, the input to output can be precisely controlled.

Figure 5:
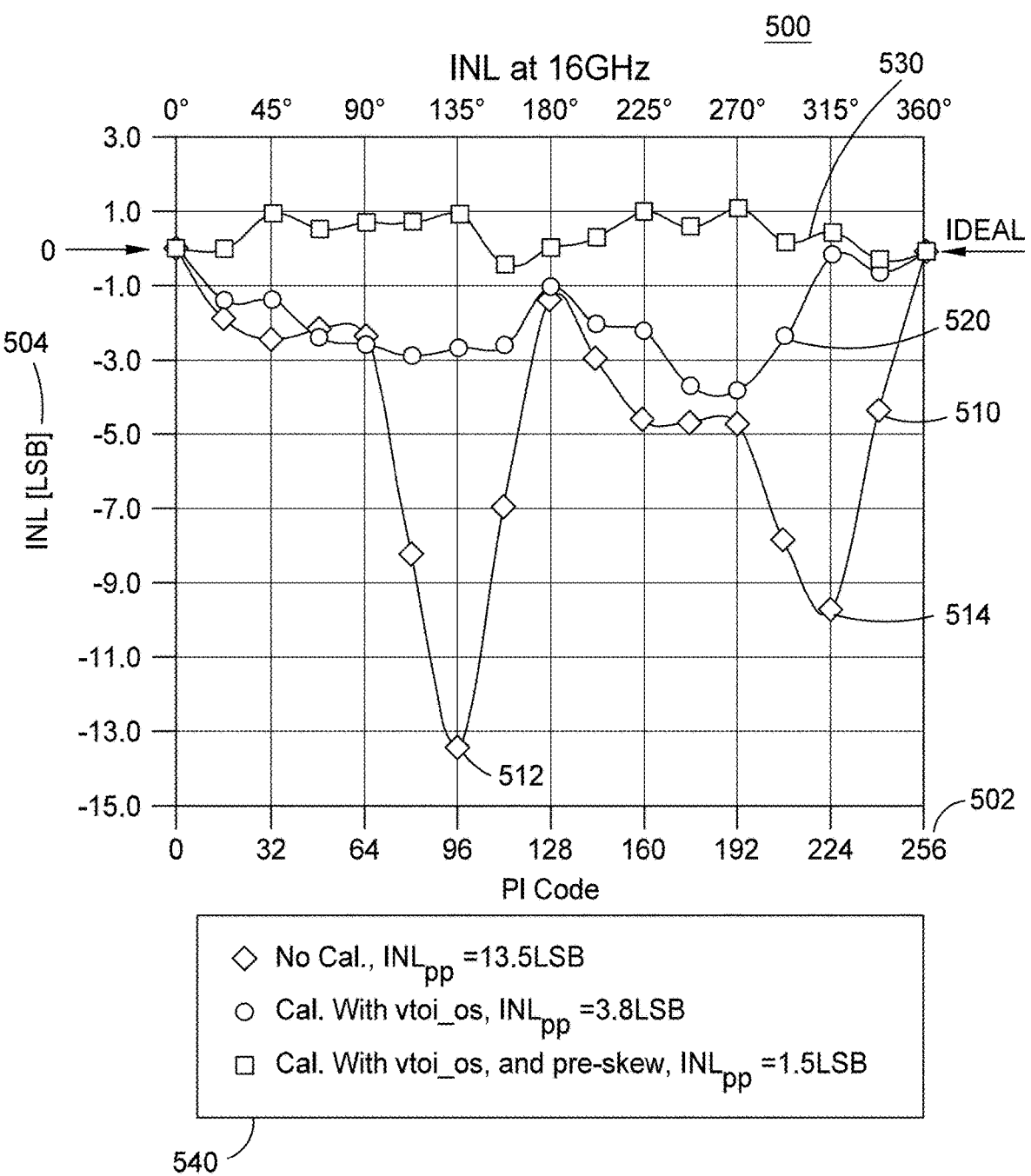
FIG. 5 illustrates a graph showing improvements achieved using the calibration circuit of FIG. 2, according to an example.

FIG. 5 illustrates a graph 500 showing improvements achieved using the calibration circuit of FIG. 2, according to an example.

The x-axis 502 of the graph 500 represents the PI code and the y-axis of the graph 500 represents the integration nonlinearity error (INL) 504. The INL indicates the deviation from an ideal value. The graph 500 depicts a first line 510, a second line 520, and a third line 530.

The first line 510 illustrates two injection phases, that is, a first injection phase at 96 (region 512) and a second injection phase at 224 (region 514). The x-axis extends from 0 to 255. Thus, there are 256 values, which is essentially 8 bits. Since there are 8 phases and 8 bits, dividing 256 by 8 results in a 32 value frame. As such, from 0 to 32 represents 1 phase or 45 degrees. In the graph 500, from 0 to 32 is 45 degrees, from 32 to 64 is 90 degrees, from 64 to 96 is 135 degrees, from 96 to 128 is 180 degrees, and so on. Another way to view it is from 0 to 32 is ⅛, from 32 to 64 is ⅔, from 64 to 96 is ⅜, from 96 to 128 is ⅘, and so on.

Therefore, in the first injection phase, the value 96 is at 135 degrees. In the first line 510, the INL is 13.5 LSB at the value 96, which is at 135 degrees. This means that the value 96 ideally should be on or close to 0 INL. However, the value 96 is off by 13.5 LSB. This translates to an offset of about 20 degrees. As such, ideally, the phase should be 135 degrees, however, the actual phase or measured phase is 115 degrees at the value 96.

In the second injection phase, the second injection phase, the value 224 is at 315 degrees. In the first line 510, the INL is 10 LSB at the value 224, which is at 315 degrees. This means that the value 224 ideally should be on or close to 0 INL. However, the value 224 is off by 10 LSB. This translates to an offset of about 15 degrees. As such, ideally, the phase should be 315 degrees, however, the actual phase or measured phase is 300 degrees at the value 224.

These phase offsets or deviations can be corrected by the multi-phase generation circuit that includes the ILO 210, as well as the mixer 214, the IDAC 216 and the VTOI 218.

If the mixer 214 is added with the IDAC 216 and the VTOI 218, the phase difference is corrected. However, by adding the mixer 214 with the IDAC 216 and the VTOI 218, noticeable phase differences can be still be present. In other words, the phase compensation provided by the mixer 214 with the IDAC 216 and the VTOI 218 is not sufficient enough to provide for proper phase compensation. One reason for this is the two-phase input (i.e., the clock signal 202) may disturb the symmetry of the oscillator of the ILO 210. This input disturbance may be detectable by the mixer 214, which causes a further offset within the mixer 214.

In the first injection phase, the value 96 is at 135 degrees. In the second line 520, the INL is 2.8 LSB at the value 96, which is at 135 degrees. This means that the value 96 ideally should be on or close to 0 INL. However, the value 96 is off by 2.8 LSB. This is a significant improvement from the first line 510 showing the INL at 13.5 LSB. However, it is still large enough to provide for noticeable phase differences.

In the second injection phase, the value 224 is at 315 degrees. In the second line 520, the INL is 0.5 LSB at the value 224, which is at 315 degrees. This means that the value 224 ideally should be on or close to 0 INL. The value 224 is close enough to the 0 INL to cause a negligible phase offset. However, it would be better to provide for even further phase compensation.

Further phase compensation can be achieved by incorporating the skew control code 264. The skew control code 264 is computed after the input disturbances from the mixer 214 have been corrected for by the VTOI 218 and the IDAC 216.

The third line 530 illustrates the phase offset being between 1.5 LSB. Thus, the addition of the skew control code 264 reduced the peak-to-peak LSB from 3.8 LSB to 1.5 LSB, which is acceptable in providing for accurate phase compensation. The LSB data is provided in table 540.

In summary, and referring to table 540, the uncalibrated $INL_{pp}$ at 16 Ghz is up to 13.5 LSB. The calibrated $INL_{pp}$ with the VTOI and IDAC is improved to 3.8 LSB, and this shows it effectively removes significant errors from the injection locking. The calibrated $INL_{pp}$ with both the VTOI and IDAC, as well as with the pre-skew buffers is only 1.5 LSB thanks to the fine-tuned 8-phase clocks.

FIG. 6 illustrates a method for implementing the calibration circuit of FIG. 2, according to an example.

At block 602, feed a multi-phase clock generator with a clock signal and generating a multi-phase clock output. In one example, the multi-phase clock generator 110 generates 8-phase clocks. Thus, the multi-phase clock generator 110 receives the two-phase clocks (i.e., the first phase clock signal 104 and the second phase clock signal 106) to generate 8-phase clocks 112. The 8-phase clocks 112 may be offset by 45 degrees ideally.

At block 604, send the multi-phase clock output to a pre-skew buffer and generating multiple data signals. The pre-skew buffer 130 is used to compensate for skew or timing misalignment between parallel data signals before they are transmitted over a data bus. The 8 data signals (i.e., the 8-phase clocks 112) received by the pre-skew buffer 130 may be weighted.

At block 606, send the multiple data signals to a phase interpolator (PI) and generating a shifted clock signal of the clock signal received by the multi-phase clock generator. A user can select which of the 8 data signals 132 to send to the PI 140. In one example, the user selects any neighboring pair of the 8 data signals 132 to send to the PI 140. The PI 140 then generates an output clock 145 (CLK_PI) based on the two selected data signals.

At block 608, generate, using a phase detection circuit, a calibration code and a PI code, the calibration code fed to the multi-phase clock generator and the pre-skew buffer, and the PI code fed to the PI to adjust non-linearity of the PI. The phase detection circuit 260 generates three codes, that is, a PI code 262, a skew control code 264, and a VTOI code 266. The skew control code 264 is fed back to the pre-skew buffer 220 and the PI code 262 is fed back into the PI 230. As noted above, a weight is assigned to the two signals that are selected at the output of the ILO 210. The weights are assigned by the pre-skew buffer 220.

In conclusion, detecting non-linearity in phase interpolators (PI) is beneficial for ensuring the accuracy, reliability, and performance of phase estimation, signal generation, and timing recovery in electronic systems. The linearity of a PI directly determines the jitter tolerance and also the performance under spread spectrum clocking or ppm tracking in the clock data recovery system. As the link data rate continues to increase, the PI operation frequency also increases accordingly, forcing the PI to have a finer timing resolution. However, the PI resolution is degraded by various sources, including intrinsic interpolation errors, input phase errors, layout imperfections, and transistor mismatches. In the example embodiments, the PI employed by the CDR circuit is calibrated to correct for non-linearities, which may lead to errors in phase estimation and signal generation, as well as errors in timing recovery. By correcting non-linearities of the PI, the CDR can meet its timing budget to achieve accurate data recovery. As such, the PI has finer timing resolution. The calibration involves using an ILO and a VTOI. The ILO provides for phase control by synchronizing with an external injection signal. In particular, the phase nonlinearity of the PI is sensed by phase detection circuits based on digital sampling or other algorithms with little circuit overhead. Therefore, the calibration system is a closed loop system that can be adapted for different protocols under process variations. The calibration algorithm first finds the optimal code for the current DAC of the VTOI circuit, and tunes the QLL of the ILO to a better operating point such that the injection phase error is minimized. Thus, a high injection strength can be selected while the injection phase errors are minimal. Furthermore, 8-phase pre-skew buffers fine tune the 8-phase clocks entering the PI. All the phase errors caused by random circuit mismatches, layout imperfections, and residual errors from the injection locking can be thus be minimized.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A calibration circuit comprising:
a multi-phase clock generator configured to receive a clock signal and generate a multi-phase clock output, the multi-phase clock generator including:
a first injection-locked oscillator;
a mixer;
a current digital-to-analog converter (IDAC); and
a voltage to current converter (VTOI), the IDAC and VTOI configured to fine tune offsets of the mixer;
a pre-skew buffer configured to receive the multi-phase clock output from the multi-phase clock generator and generate multiple data signals; and
a phase interpolator (PI) configured to receive the multiple data signals from the pre-skew buffer and generate a shifted clock signal of the clock signal received by the multi-phase clock generator.

2. The calibration circuit of claim 1, wherein the multi-phase clock output includes 8-phase clocks offset by 45 degrees.

3. The calibration circuit of claim 1, wherein a subset of the multi-phase clock output received by the pre-skew buffer is weighted to allow the pre-skew buffer to fine tune phase offsets of the subset of the multi-phase clock output.

4. The calibration circuit of claim 1, wherein an output of the PI is fed to a second injection-locked oscillator.

5. The calibration circuit of claim 4, wherein the second injection-locked oscillator generates four phases that are fed into buffers to produce four clock signals.

6. The calibration circuit of claim 5, wherein a subset of the four clock signals is fed into a phase detection circuit that generates a PI code, a skew control code, and a VTOI code.

7. The calibration circuit of claim 5, wherein the four phases output by the second injection-locked oscillator are shifted by a same amount as the shifted clock signal of the PI.

8. The calibration circuit of claim 1, wherein a frequency of the first injection-locked oscillator is configured to match an input frequency of the clock signal.

9. The calibration circuit of claim 1, wherein the IDAC is coupled to the VTOI to apply a reverse amount of voltage detected at an output of the mixer and an input of the VTOI, and overcome phase errors from injection locking disturbance.

10. The calibration circuit of claim 1, wherein the IDAC includes a first set of transistors and a second set of transistors configured to adjust voltage output of the mixer.

11. A calibration circuit comprising:
a multi-phase clock generator configured to receive a clock signal and generate a multi-phase clock output;
a pre-skew buffer configured to receive the multi-phase clock output and generate multiple data signals;
a phase interpolator (PI) configured to receive the multiple data signals and generate a shifted clock signal of the clock signal received by the multi-phase clock generator; and
a phase detection circuit configured to generate a calibration code and a PI code, the calibration code fed to the multi-phase clock generator and the pre-skew buffer, and the PI code fed to the PI to adjust non-linearity of the PI.

12. The calibration circuit of claim 11, wherein the multi-phase clock generator includes a first injection-locked oscillator, a mixer, a current digital-to-analog converter (IDAC), and a voltage to current converter (VTOI), the IDAC and VTOI configured to fine tune offsets of the mixer and the VTOI, and disturbance from injection locking.

13. The calibration circuit of claim 12, wherein the IDAC is coupled to the VTOI to apply a reverse amount of voltage detected at an output of the mixer and an input of the VTOI, and overcome phase errors resulting from injection locking disturbance.

14. The calibration circuit of claim 11, wherein the multi-phase clock output includes 8-phase clocks offset by 45 degrees.

15. The calibration circuit of claim 11, wherein a subset of the multi-phase clock output received by the pre-skew buffer is weighted to allow the pre-skew buffer to fine tune phase offsets of the subset of the multi-phase clock output.

16. The calibration circuit of claim 11, wherein an output of the PI is fed to a second injection-locked oscillator.

17. The calibration circuit of claim 16, wherein the second injection-locked oscillator generates four phases that are fed into buffers to produce four clock signals.

18. The calibration circuit of claim 17, wherein the four phases output by the second injection-locked oscillator are shifted by a same amount as the shifted clock signal of the PI.

19. A method comprising:
feeding a multi-phase clock generator with a clock signal and generating a multi-phase clock output;
sending the multi-phase clock output to a pre-skew buffer and generating multiple data signals;
sending the multiple data signals to a phase interpolator (PI) and generating a shifted clock signal of the clock signal received by the multi-phase clock generator; and
generating, using a phase detection circuit, a calibration code and a PI code, the calibration code fed to the multi-phase clock generator and the pre-skew buffer, and the PI code fed to the PI to adjust non-linearity of the PI.

20. The method of claim 19, wherein the multi-phase clock generator includes a first injection-locked oscillator, a mixer, a current digital-to-analog converter (IDAC), and a voltage to current converter (VTOI), the IDAC and VTOI configured to fine tune offsets of the mixer and an input of the VTOI, and overcome phase errors from injection locking disturbance.

* * * * *